United States Patent [19]

Kobayashi

[11] Patent Number: 5,573,972
[45] Date of Patent: Nov. 12, 1996

[54] METHOD FOR MANUFACTURING A SILICON BONDED WAFER

[75] Inventor: Kenya Kobayashi, Tokyo, Japan

[73] Assignee: NEC Corporation, Tokyo, Japan

[21] Appl. No.: 506,980

[22] Filed: Jul. 28, 1995

[30] Foreign Application Priority Data

Jul. 29, 1994 [JP] Japan ................................. 6-177876

[51] Int. Cl.⁶ ................................................. H01L 21/76
[52] U.S. Cl. ................................. 437/63; 437/62; 437/67; 437/974; 148/DIG. 12
[58] Field of Search .................................. 437/67, 62, 974, 437/63; 148/DIG. 12

[56] References Cited

U.S. PATENT DOCUMENTS

| | | | |
|---|---|---|---|
| 4,784,970 | 11/1988 | Solomon | 437/67 |
| 4,837,186 | 6/1989 | Ohata et al. | 148/DIG. 12 |
| 4,948,748 | 8/1990 | Kitahara et al. | 437/62 |
| 4,963,505 | 10/1990 | Fujii et al. | 437/62 |
| 5,356,827 | 10/1994 | Ohoka | 437/974 |
| 5,374,582 | 12/1994 | Okonogi et al. | 148/DIG. 12 |

FOREIGN PATENT DOCUMENTS 4-29353  1/1992  Japan .

Primary Examiner—Trung Dang
Attorney, Agent, or Firm—Sughrue, Mion, Zinn, Macpeak & Seas

[57] ABSTRACT

A method for manufacturing a silicon bonded wafer includes the steps of preparing a first substrate of a lightly doped N-silicon having a plurality of V-grooves, preparing a second substrate of a heavily doped N-silicon having a first portion covered by an insulating film and a second portion having a top surface flush with the surface of the insulating film, bonding the first and the second substrates such that the V-grooves are located on the insulating film of the first portion of the second substrate, and grinding the first substrate at the back surface to provide a bonded wafer having a main surface exposing therein the bottom of the grooves. The grooves separate the bonded wafer into a power element forming region and a plurality of control circuit forming regions. The inverted V-grooves reduces less amount of areas for forming the control elements.

22 Claims, 7 Drawing Sheets 5,573,972

METHOD FOR MANUFACTURING A SILICON BONDED WAFER

BACKGROUND OF THE INVENTION (a) Field of the Invention

The present invention relates to a method for manufacturing a silicon bonded wafer and, more particularly, to a method for manufacturing a silicon bonded wafer used for fabricating a composite semiconductor device including a power transistor element and control circuit elements.

(b) Description of the Related Art

A composite semiconductor device is known in which a power transistor element having a high breakdown voltage and called a vertical transistor and control circuit elements called lateral transistors are provided on a common semiconductor substrate. In a composite semiconductor device, a current path of the power transistor is formed from the top surface to the bottom surface of the semiconductor substrate and it is particularly important to provide a satisfactory separation between a vertical element forming region for receiving the power transistor and a lateral element forming region (or control circuit forming region) for receiving the control circuit(s). A silicon bonded wafer has been proposed to meet such a requirement. For example, in the silicon bonded wafer disclosed in Patent Publication No. JP-A-4(1992)-29353, the lateral element forming region has an SOI structure.

The conventional method for manufacturing a silicon bonded wafer described in the publication as mentioned above is shown in FIGS. 1A through 1E.

A first substrate 311 made of a heavily doped N-type monocrystalline silicon is prepared. The first substrate 311 has a main surface 312 oriented in a lattice plane (100). A flat recess 314 is formed by, for example, a reactive ion etching (RIE) process in an area corresponding to a lateral element forming region for receiving control circuit. An insulating film 315 is formed over the main surface 312 including the surface of the flat recess 314, as shown in FIG. 1A. Subsequently, at least the insulating film 315 is ground and polished to leave a portion of the insulating film 315a filling the flat recess 314 and having a top surface flush with the main surface 312 of the power element forming region, as shown in FIG. 1B. A second substrate 301 made of, for example, a lightly doped N-type monocrystalline silicon is prepared which has a main surface 302 oriented in a lattice plane (100). The first and the second substrates 311 and 301 are coupled to each other such that the main surface 312 of the first substrate 311 meets the main surface 302 of the second substrate 301, with the crystal axes thereof coinciding with each other. The first and second substrates 311 and 301 are then subjected to a heat treatment to bond the first substrate 301 and the second substrate 311 together, as shown in FIG. 1C.

Next, the second substrate 301 is ground and polished at the side of the second surface thereof opposing the main surface 302 of the second substrate 301 to obtain a predetermined thickness of the second substrate 301. Subsequently, an insulating film 303 is formed over the entire polished surface of the second substrate 301. The insulating film 303 is made of a material having an etch rate different from that of the insulating film 315a. The insulating film 303 is then subjected to a patterning process. Then, an anisotropic wet etching process is performed by using the patterned insulating film 303 as a mask to form separating grooves 304 (V-grooves) each having a V-shaped cross section and reaching the surface of the insulating film 315a. By formation of the V-grooves 304, the second substrate 301 is divided into a vertical element forming region 301a and a plurality of lateral element forming regions 301b, as shown in FIG. 1D. Subsequently, the insulating film 303 is removed, following which another insulating film 305 is formed as covering the entire surface including the surfaces of the V-grooves 304 and the polished surfaces of the vertical element forming region 301a and the lateral element forming regions 301b, as shown in FIG. 1E.

Next, a polycrystalline silicon film 306 having a thickness greater than the depth of the V-grooves 304 (i.e., the thickness of the lateral element forming regions 301b) is formed to cover the vertical element forming region 301a, the lateral element forming regions 301b and the V-grooves 304, as shown in FIG. 1F. Subsequently, the polycrystalline silicon film 306 and the insulating film 305 are ground and polished to expose the top silicon surfaces of the vertical element forming region 301a and lateral element forming regions 301b of the second substrate 301, thereby leaving portions of the polycrystalline silicon film 306a and portions of the insulating film 305a in the V-grooves 304, as shown in FIG. 1G. As a result, separation between the vertical element forming region 301a and one of the lateral element forming regions 301b and between adjacent each two lateral element forming regions 301b is obtained in a silicon bonded wafer.

In a silicon bonded wafer, a demand for miniturization of the device dimension is increasing as in the case of other types of semiconductor devices.

SUMMARY OF THE INVENTION

It is an object of the present invention to provide an improved method for manufacturing a silicon bonded wafer in which the effective area of the element forming regions is large for meeting the requirement for miniturization of the device.

According to the present invention, there is provided a method for manufacturing a silicon bonded wafer including steps of: preparing a first silicon substrate having a first surface and a second surface opposing the first surface, the first surface having at least one groove therein, at least the surface of the groove being covered by an insulator; preparing a second silicon substrate having a third surface and a fourth surface opposing the third surface, the third surface having a first portion covered by an insulating film and a second portion exposing a silicon surface, the top surface of the insulating film being flush with the second portion; bonding the first silicon substrate and the second silicon substrate such that the first surface contacts the third surface and such that the groove is located on the insulating film; grinding the first silicon substrate at the side of the second surface thereof to provide a fifth surface exposing the insulator of the grooves therein.

In the method according to the present invention, it is preferable that the first and second silicon substrate are a lightly doped substrate and a heavily doped substrate, respectively.

Preferably, the grooves has a shape of V-character or U-character. The grooves may be filled with a polycrystalline silicon or may be filled with the insulator.

Preferably, the polycrystalline silicon film is formed by a CVD or an epitaxial growth process.

The above and other objects, features and advantages of the present invention will be more apparent from the fol-

DESCRIPTION OF THE PREFERRED EMBODIMENTS

The present invention will now be described with reference to the accompanying drawings.

FIGS. 2A through 2I show a method for manufacturing a silicon bonded wafer according to a first embodiment of the present invention. The silicon bonded wafer of the present embodiment is formed of a first and a second substrates separately prepared, as in the case of the conventional bonded wafer.

The first substrate is made of a lightly doped N-type monocrystalline silicon, and has a first surface 102 (top surface) and a second surface 107 (bottom surface) opposing the first surface 102. The first surface 102 is oriented in a lattice plane (100) and ground and polished to form a mirror surface by chemical-mechanical polishing (CMP).

Figure 2A:
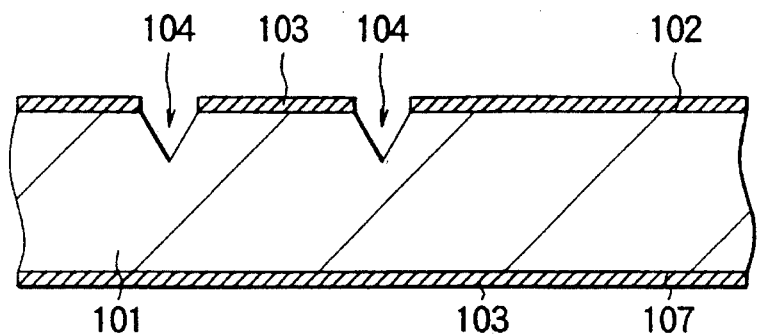
FIGS. 2A through 2I are cross-sectional views of a first substrate, a second substrate and a silicon bonded wafer in consecutive steps of a method for manufacturing the silicon bonded wafer according to a first embodiment of the present invention.

A first silicon oxide film 103 is formed, by thermal oxidation, on the entire surface of the first substrate 101 including the first surface 102 and the second surface 107 thereof. Subsequently, the first silicon oxide film 103 on the first surface 102 is selectively etched for patterning by an ion-etching process using an unillustrated photoresist pattern as a mask. By the ion-etching process, the first silicon oxide film 103 is removed in the portions covering the regions to be formed as separation regions between a vertical element forming region and one of lateral element forming regions and between adjacent two of the lateral element forming regions. After removing the photoresist pattern, the first surface 102 of the first substrate 101 is subjected to anisotropic etching by a wet etching in which the patterned silicon oxide film 103 is used as a mask and potassium hydroxide, for example, is used as an alkaline etchant. As a result, grooves 104 each having a V-shaped cross section (referred to as V-grooves, hereinafter) are formed, as shown in FIG. 2A.

For example, each of the V-grooves 104 has a depth of 10 μm and a width of 14.1 μm ($\sqrt{2.10}$ μm), which is a preferable width for the grooves 104 having a depth of 10 μm, at the first surface 102 of the first substrate 101. The angle between the slant surface of the V-groove 104 and the first surface 102 is, for example, 54.7 degrees. The depth of the grooves 104 may be selected in the range between about 2 μm and a few tens μm in dependence on the required performance of a power transistor having a high breakdown voltage. The preferable width of the portions of the silicon oxide film 103 to be etched is determined based on the depth of the V-grooves 104. Although it is preferable that the portions of the silicon oxide film 103 to be etched have the preferable width, the practical width is not limited thereto. When some of the portions of the silicon oxide film 103 to be etched have a width greater than the preferable width, a special care must be taken on the time period for the etching using the alkaline etchant to perform "a just etching". In this case, one of the grooves having a width larger than those of others has an inverted-trapezoidal cross section.

Figure 2B:
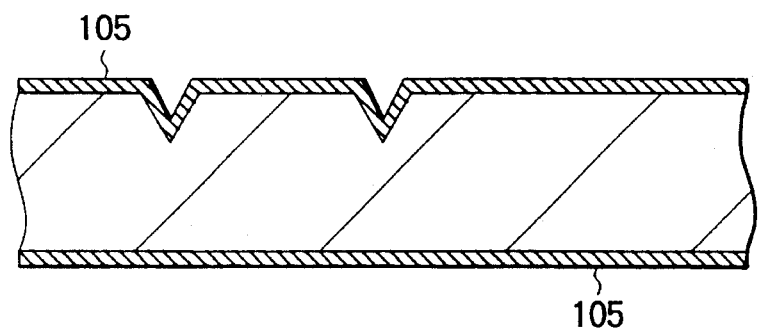
Figure 2C:
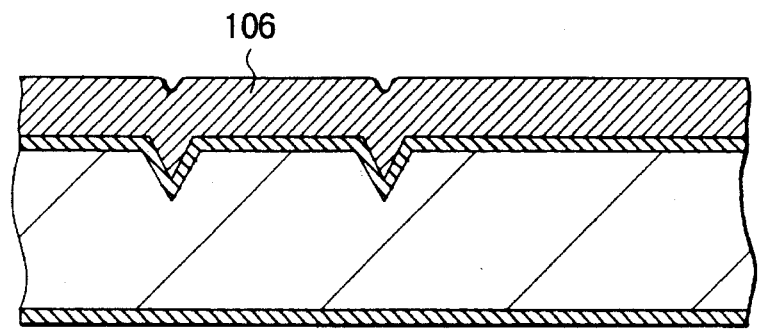

Next, the first silicon oxide film 103 is entirely removed from the first substrate 101 by etching. Subsequently, the entire surface of the first substrate 101 including the surface of the V-grooves 104, the first surface 102 and second surface 107 is subjected to thermal oxidation so that a second silicon oxide film 105 which has a thickness of about 0.5 μm, for example, is formed, as shown in FIG. 2B. Thereafter, a polycrystalline silicon film 106 which has a thickness of about 12 μm, for example, is formed on the second silicon oxide film 105 on the first surface 102 by a CVD process, as shown in FIG. 2C.

If the depth of the V-grooves 104 were equal to or less than 1 μm, an insulating film might be formed on the first surface 102 by the CVD process to form the filling layer in the V-grooves, instead of forming the polycrystalline silicon film 106 and the second insulating film 105 on the first surface 102. Since the depth of the V-grooves 104 is larger than 1 μm in the present embodiment, however, as is the case of general composite semiconductor devices, polycrystalline silicon film 106 is employed to form a filling layer in the V-grooves to avoid generation of cracks in the filling layer and warping of the first substrate 101 after the formation of the filling layer.

The thermal oxidation is employed for forming the second silicon oxide film 105 in view that the second silicon oxide film 105 formed by a thermal oxidation has low variations in the thickness, which is desired for receiving the filling layer in the V-grooves 104. Also, by covering the entire surface of the first substrate 101 with the second silicon oxide film 105, generation of a warp in the first substrate 101 can be prevented, which would otherwise arise after the polycrystalline silicon film 106 is formed. If an epitaxial growth apparatus which thermally decomposes dichlorosilane, for example, at about 700° C. is used to form the polycrystalline silicon film 106, generation of cracks can be prevented and generation of stress can be reduced more effectively while providing a high speed for forming the film.

Figure 2D:
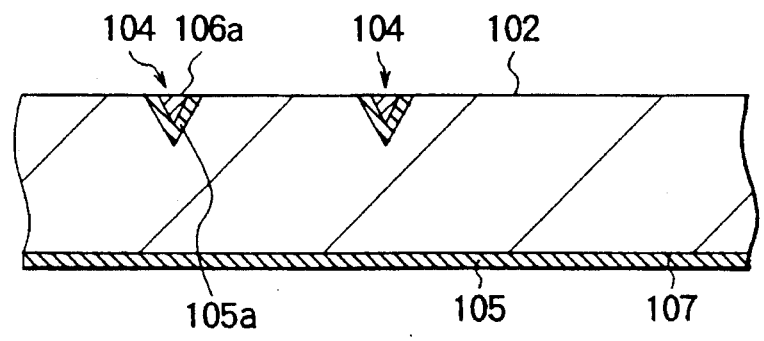

Subsequently, the polycrystalline silicon film 106 and the silicon oxide film 105 are ground and polished by chemical-mechanical polishing (CMP) to expose the first surface 102 of the first substrate 101. As a result, portions of the polycrystalline silicon layer 106a and portions of the silicon oxide film 105a are left in the V-grooves 104 as filling layers, as shown in FIG. 2D. The CMP is performed by using a solution of potassium hydroxide or ammonia into which particles of silica or particles of cerium oxide are dispersed.

Figure 2E:
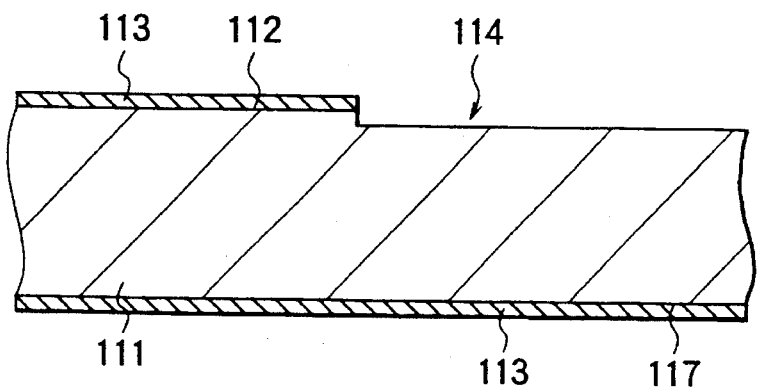

A second substrate 111 is prepared separately from the first substrate 101 as a heavily doped N-type monocrystalline silicon substrate having a first surface 112, which is oriented in a lattice plane (110) and formed as a mirror surface, and a second surface 117 opposing the first surface 112. A first silicon oxide film 113 is formed, by thermal oxidation, on the entire surface of the second substrate 111 including the first surface (or third surface) 112 and a second surface 117 (or fourth surface) opposing the first surface 112. Subsequently, the first silicon oxide film 113 on the first surface 112 is selectively etched in a portion corresponding to a lateral element forming region by using an unillustrated photoresist pattern as a mask. The first surface 112 of the second substrate 111 is then subjected to anisotropic etching by RIE in which the photoresist pattern is used as a mask, so that a flat recess 114 having a depth of about 1 μm, for example, is formed, as shown in FIG. 2E.

Figure 2F:
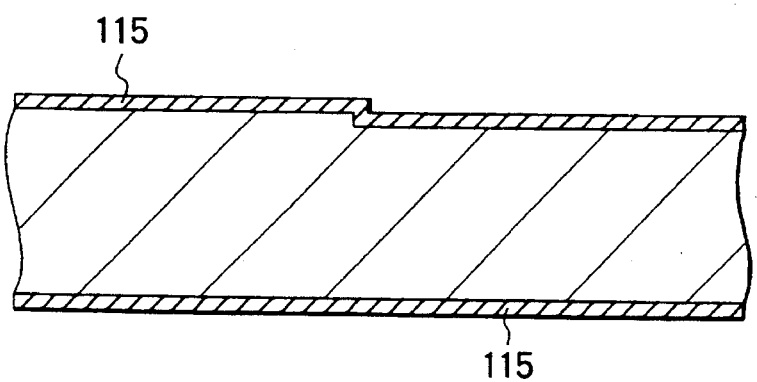

After removing the photoresist pattern, the first silicon oxide film 113 is removed from the entire surface of the second substrate 111 by etching. Subsequently, the entire surface of the second substrate 111 including the recess 114, the first surface 112 and the second surface 117 is subjected to thermal oxidation so that a second silicon oxide film 115 which has a thickness of about 1 μm, for example, is formed, as shown in FIG. 2F.

Figure 2G:
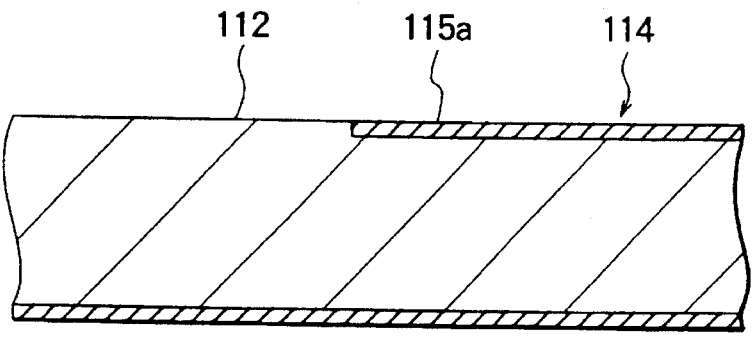

Next, the second silicon oxide film 115 on the first surface 112 is ground and polished by chemical-mechanical polishing (CMP) to expose the first surface 112 of the second substrate 111 in the power element forming region. As a result, a silicon oxide film 115a is left in the flat recess 114 as a filling layer having a top surface flush with the first surface 112 of the second substrate 111 in the power element forming region, as shown in FIG. 2G.

The second silicon oxide film 115 may be replaced by a film made of another insulator. Also, it is not necessarily required to select the thickness of the second silicon oxide film 114 equal to the depth of the flat recess 114. If the thickness of the second silicon oxide film 115 is not equal to the depth of the flat recess 114, a special care should be taken during the CMP process.

When the thickness of the second silicon oxide film 115 is greater than the depth of the flat recess 114, the CMP process is stopped at the time instant when the first surface 112 of the substrate 111 in the power element forming region is exposed. On the other land, when the thickness of the second silicon oxide film 115 is smaller than the depth of the flat recess 114, the CMP must be performed for both the silicon oxide film 115 and the first surface 112 of the second substrate 111. In this case, the grinding and polishing speeds for the silicon oxide film 115 and the second substrate 111 can be made equal to each other by using a solution of ammonium into which particles of cerium oxide are dispersed.

Subsequently, both the first grooves 102 of the first substrate 101 and the first surface 112 of the second substrate 111 are modified to hydrophilic surfaces by a known surface treatment. Thereafter, the first surface 102 of the first substrate 101 and the first surface 112 of the second substrate 111 are coupled together such that the surface of the polycrystalline silicon film 106a and the edge of the insulating film 105a directly contact the surface of the silicon oxide film 115a of the second substrate 111 and such that the crystal orientation of the first surface 102 of the first substrate 101 coincides with the crystal orientation of the first surface 112 of the second substrate 111.

Figure 2H:
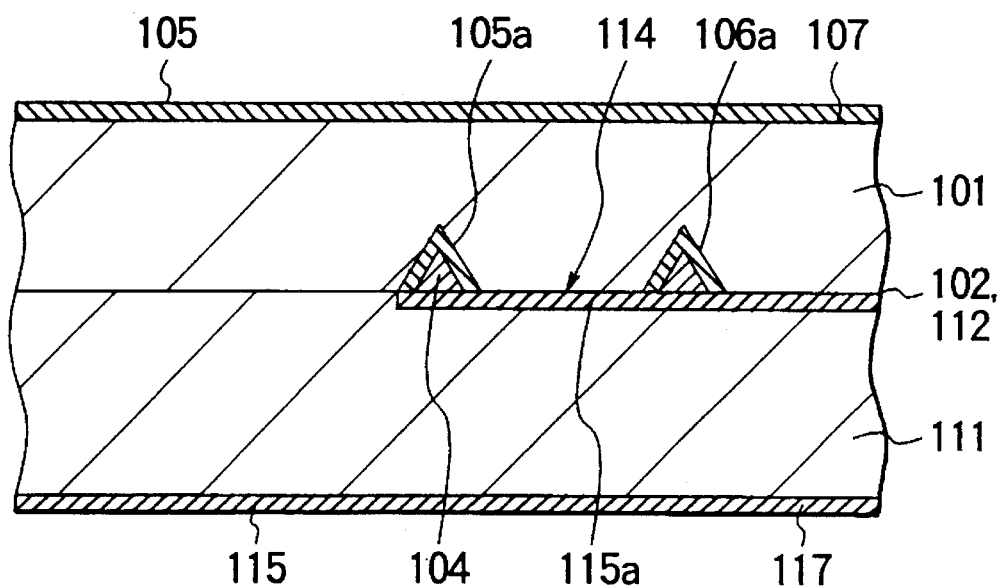

Then, the first and second substrates 101 and 111 are subjected to a heat treatment at a temperature in the range between about 1100° C. and about 1200 ° C., so that the first and second substrates 101 and 111 are bonded together, as shown in FIG. 2H. In this stage, both the silicon oxide film 105 and the silicon oxide film 115 remain on the second surface 107 of the first substrate 101 and the second surface 117 of the second substrate 111, respectively, as shown in the drawing. However, these second silicon oxide films 105 and 115 may be removed before the bonding of both the substrates 101 and 111.

Figure 2I:
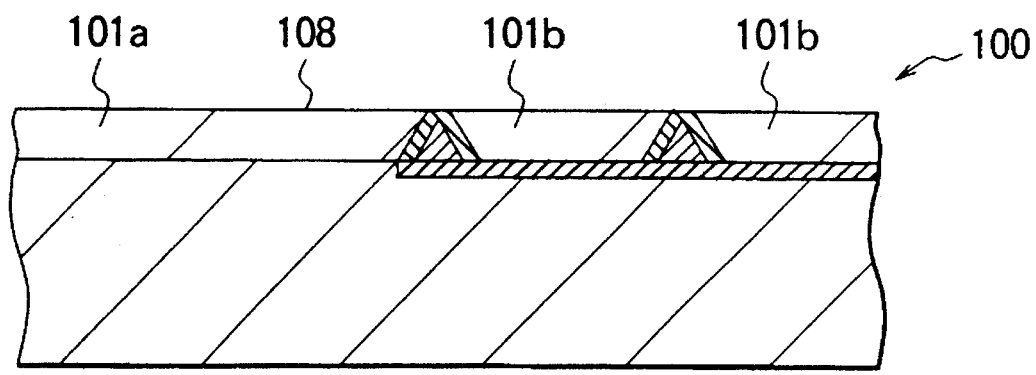

After removing the silicon oxide films 105 and 115 from the second surfaces 107 and 117, the first substrate 101 is ground and polished by CMP at the side of the second surface 107 thereof to provide a main surface 108 of a silicon bonded wafer 100 exposing therein the silicon oxide films 105a in the V-grooves 104 through the bottoms of the V-grooves 104. The CMP step provides a separation between the vertical element forming region 101a and one of the lateral element forming regions 101b and a separation between each adjacent two of the lateral element forming regions, thereby completing the silicon bonded wafer 100 according to the present embodiment, as shown in FIG. 2I.

Figure 1A:
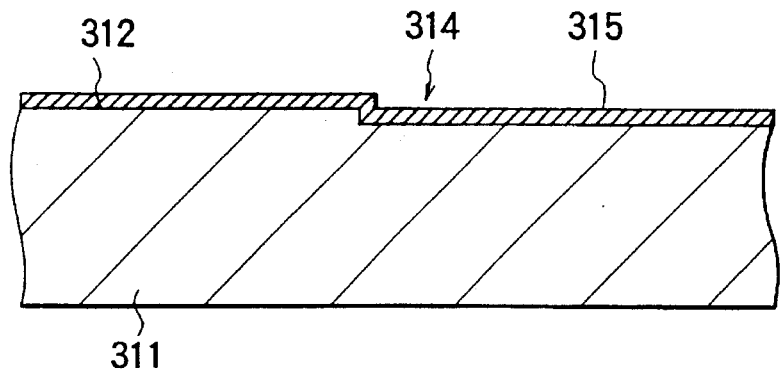
FIGS. 1A through 1G are cross-sectional views of a silicon bonded wafer in consecutive steps of a conventional method for manufacturing the silicon bonded wafer.
Figure 1B:
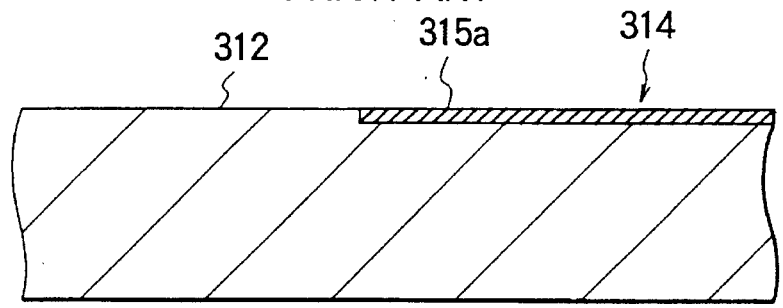
Figure 1C:
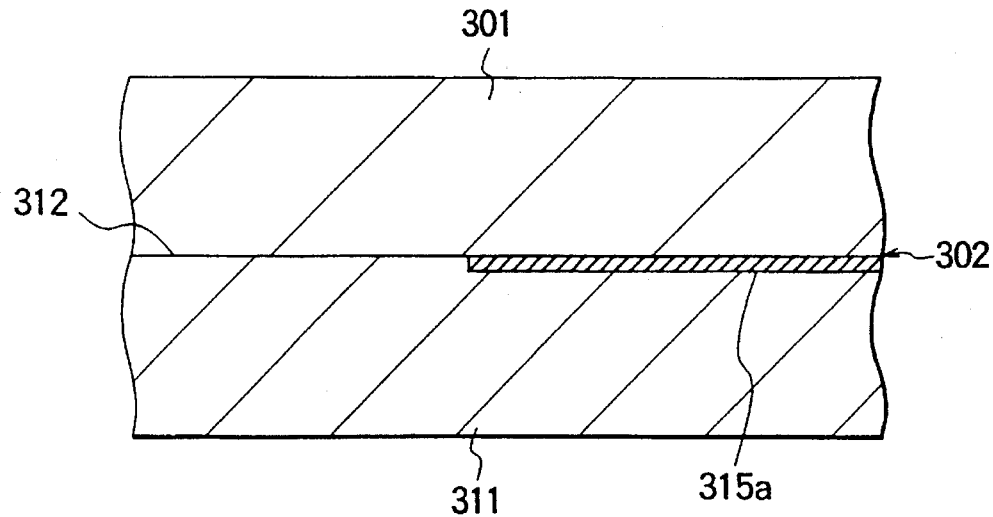
Figure 1D:
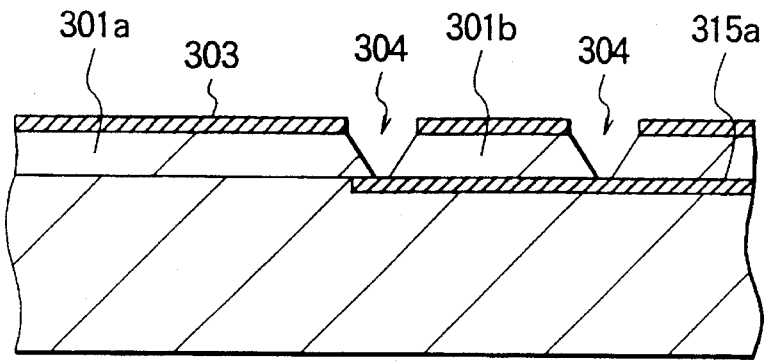
Figure 1E:
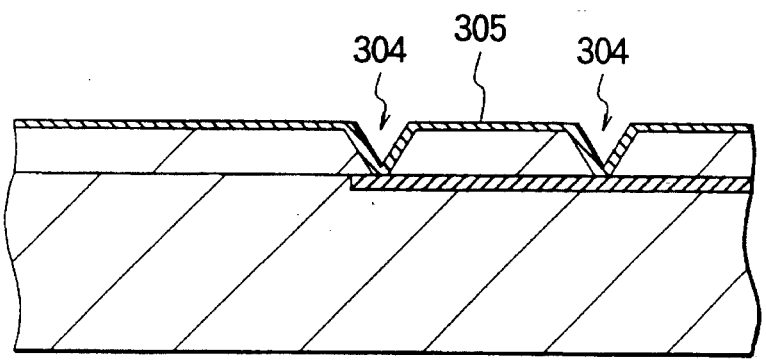
Figure 1F:
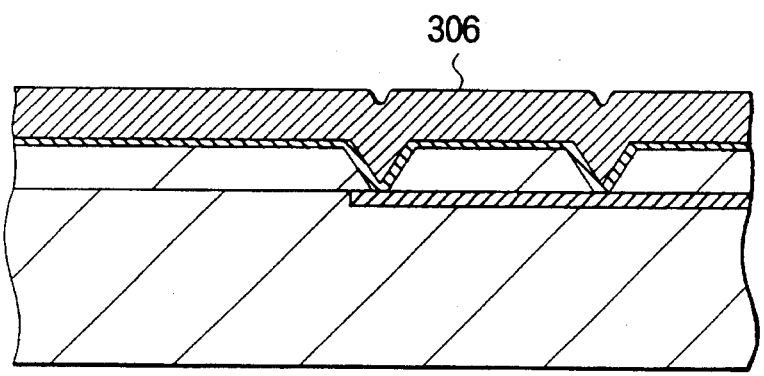
Figure 1G:
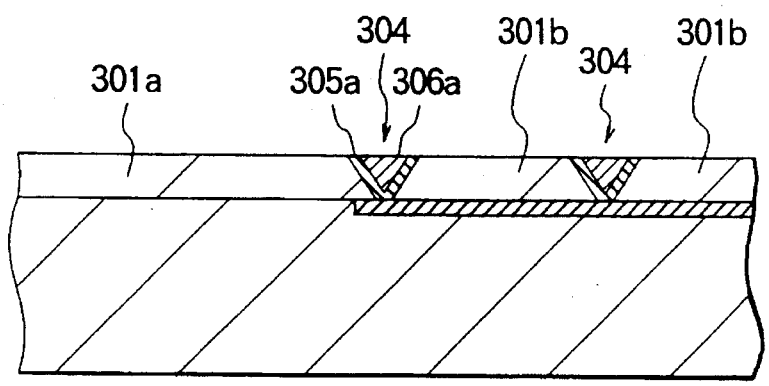

In the conventional silicon bonded wafer as shown in FIG. 1G, the separation between the vertical element forming region 301a and the lateral element forming region 301b is implemented by the V-grooves 304, and each of the V-grooves is filled with a polycrystalline silicon film 306a and an insulating film 305a and-has a wide upper surface exposed on the main surface of the bonded wafer, to thereby involve a problem in which the area for the lateral element forming regions is reduced by the configuration of the separating grooves. The present invention solves the problem involved in the conventional method by the configuration of the separating grooves.

In the first embodiment as described above, adjacent two of the lateral element forming regions 101b are separated by the silicon oxide film 105a and the polycrystalline silicon film 106a filled in one of the V-grooves 104. Also, the the vertical element forming region 101a and one of the lateral element forming regions 101b are separated by the silicon oxide film 105a and the polycrystalline silicon film 106a filled in another of the V-grooves 104 and the silicon oxide film 115a in the flat recess 114. By looking at the top surface (or main surface) of the vertical element forming region 101a and the lateral element forming regions 101b, it will be understood that the effective areas of the element forming regions 101a and 101b are larger than those of the conventional bonded wafer.

The width of each separation region at the top surface of the wafer (i.e., the width of the portion of the V-grooves which has been exposed by the CMP process) can be formed at most about 1 μm. Especially, the structure of the present embodiment can provide a large effective areas for the lateral element forming regions 101b. Generally, lateral elements can be formed in the lateral element forming region 101b within a depth of several microns (μm) as viewed from the top surface 108 of the bonded wafer 100.

In the first embodiment, it is stated that the first substrate 101 is made of a lightly doped N-type monocrystalline silicon and the second substrate 111 is made of a heavily doped N-type monocrystalline silicon. However, the materials of the first and second substrates are not limited thereto, and the present embodiment can be applied to the case where the first and second substrates are made of a lightly doped P-type monocrystalline silicon and a heavily doped P-type monocrystalline silicon, respectively.

FIGS. 3A through 3G consecutively show a process for manufacturing a silicon bonded wafer according to a second embodiment of the present invention. In the silicon bonded wafer manufactured by the method according to the second embodiment, grooves having a U-shaped cross section are formed instead of the V-grooves used in the first embodiment.

Figure 3A:
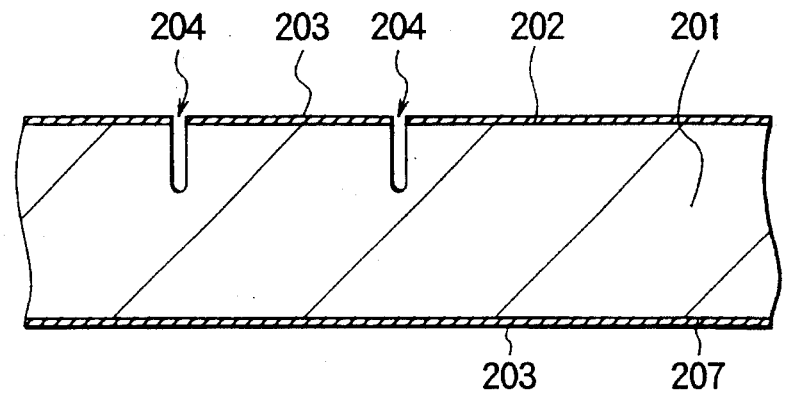
FIGS. 3A through 3G are cross-sectional views of a first substrate, a second substrate and a silicon bonded wafer in consecutive steps of a method for manufacturing the silicon bonded wafer according to a second embodiment of the present invention.
Figure 3B:
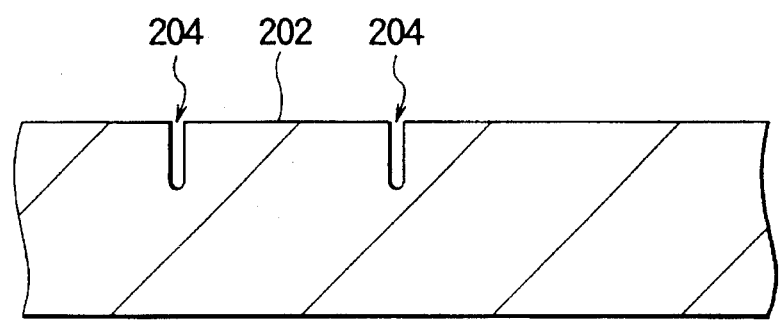

A first substrate 201 is prepared which is similar to the first substrate 101 of the first embodiment. A first silicon oxide film 203 is formed, by thermal oxidation, on a first surface 202 and a second surface 207 of the first substrate 201. Subsequently, the first silicon oxide film 203 on the first surface 202 is etched by ion-etching in which an unillustrated photoresist pattern is used as a mask, and the first substrate 201 is further anisotropic-etched at the first surface 202 by a reactive ion etching (RIE) step. As a result, grooves 204 having a U-shaped cross section (referred to as U-grooves, hereinafter) are formed, as shown in FIG. 3A. Each of the U-grooves 204 has a depth of about 5 μm and a width of about 1 μm, for example, the aspect ratio of the U-grooves 204 being about 5 accordingly. Thereafter, the silicon oxide film 203 is removed from the entire surface of the first substrate 201 by etching, as shown in FIG. 3B.

Figure 3C:
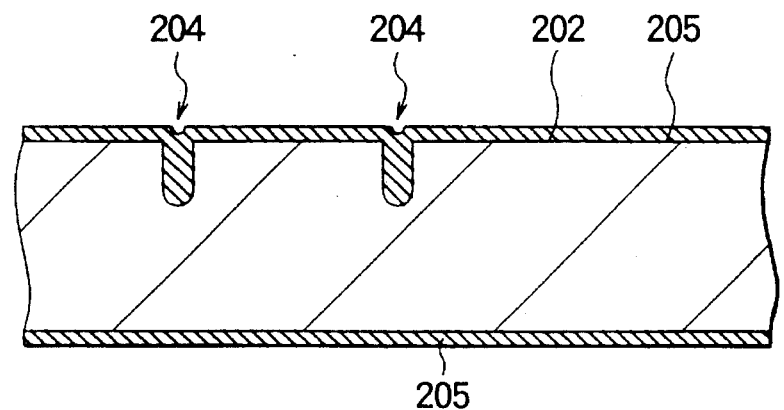

Subsequently, the entire surface of the first substrate 201 including the surface of the U-grooves 204, and the first and second surfaces 202 and 207 is subjected to thermal oxidation so that a second silicon oxide film 205 which has a thickness of about 1 μm, for example, is formed, as shown in FIG. 3C. The U-grooves 204 are completely filled with the silicon oxide film 205 in this thermal oxidation process. Although the width of the U-grooves 204 including the silicon oxide film 205 is 2 μm after the thermal oxidation process, the depth of the U-grooves 204 remains substantially in the initial state. The silicon oxide film 205 is formed in this way by employing the thermal oxidation process instead of a CVD process in view that the U-grooves 204 have a large aspect ratio.

Figure 3D:
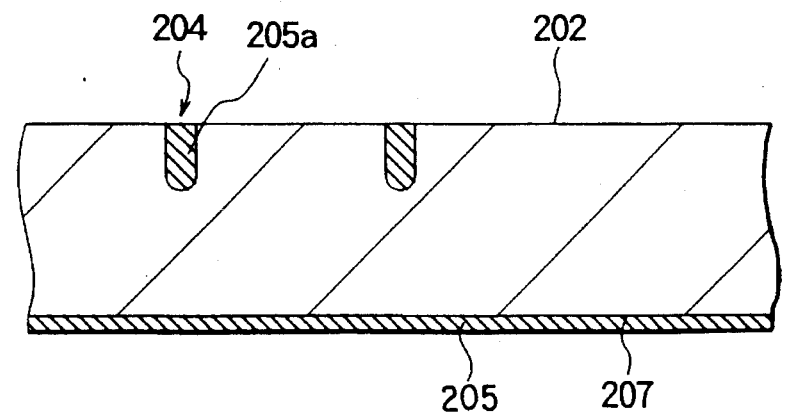
Figure 3E:
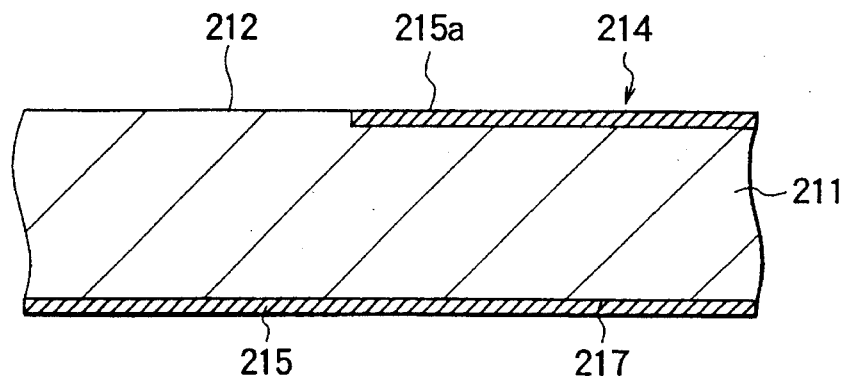

Next, the second silicon oxide film 205 on the first surface 202 of the first substrate 201 is removed by CMP to expose the first surface 202. As a result, portions of the second silicon oxide film 205a are left in the U-grooves 204 as filling layers for the U-grooves 204, as shown in FIG. 3D.

A second substrate 211 is prepared which is similar to the second substrate 111 in the first embodiment. A flat recess 214 having a depth of about 1 μm, for example, is formed in a first surface 212 of the second substrate 211 in a first area corresponding to lateral element forming regions. A second area where the flat recess 214 is not formed corresponds to a vertical element forming region. Subsequently, a first silicon oxide film 215 which has a thickness of about 1 μm, for example, is formed, on the entire surface of the second substrate 211 including the first surface 212 and a second surface 217. The first silicon oxide film 215 on the first surface 212 of the second substrate 211 is ground and polished by a CMP process so that a portion of the first silicon oxide film 215a is left in the flat recess 214, as shown in FIG. 7, the surface of the portion of the first silicon oxide film 215a being flush with the first surface 212 of the second substrate 211 in the power element forming region.

Figure 3F:
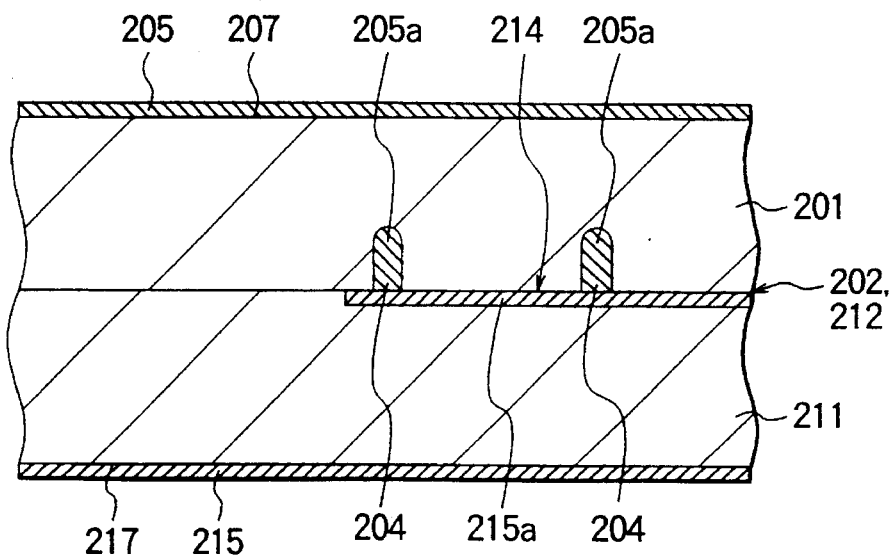

Next, both the first surface 202 of the first substrate 201 and the first surface 212 of the second substrate 211 are modified to hydrophilic surfaces by a surface treatment in the same manner as that used in the first embodiment. Thereafter, the first surface 202 of the first substrate 201 and the first surface 212 of the second substrate 211 are coupled together such that the surfaces of the filling silicon oxide films 205a directly contact the surface of the silicon oxide film 215a of the flat recess, and such that the crystal orientation of the first surface 202 of the first substrate 201 coincides with the crystal orientation of the first surface 212 of the second substrate 211. In this state, the first and second substrates 201 and 211 are subjected to a heat treatment so that the first and second substrates 201 and 211 are bonded together, as shown in FIG. 3F.

Figure 3G:
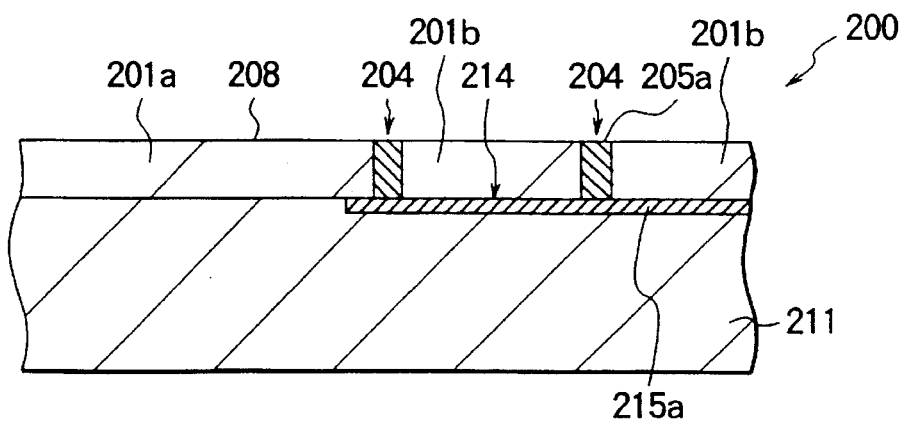

After removing the second silicon oxide films 205 and 215 from both the substrate 201 and 211 in the same manner as that used in the first embodiment, the first substrate 201 is ground and polished by a CMP process at the side of the second surface 207 thereof to provide a main surface 208 of a silicon bonded wafer 200 exposing therein the silicon oxide films 205a in the U-grooves 204 through the bottoms of the U-grooves 204. The CMP step provides a separation between the vertical element forming region 201a and one of the lateral element forming regions 201b and a separation between each adjacent two of the lateral element forming regions 201b, thereby completing the silicon bonded wafer 200 according to the present embodiment, as shown in FIG. 3G.

The silicon bonded wafer manufactured by the method according to the second embodiment has similar advantages as those obtained in the first embodiment. If it is enough in the bonded wafer that the vertical element forming region has a thickness of only a few μm, the present embodiment is more advantageous than the first embodiment because the U-grooves are more readily formed in general than the V-grooves if the depth is lower than about 10 μm.

Since above embodiments are described only for examples, the present invention is not limited to such embodiments and it will be obvious for those skilled in the art that various modifications or alterations can be easily made based on the above embodiments within the scope of the present invention.

What is claimed is:

1. A method for manufacturing a silicon bonded wafer including the steps of: preparing a first silicon substrate having a first silicon surface and a second silicon surface opposing the first silicon surface, the first silicon surface having at least one groove therein, at least the surface of the groove being covered by an insulator; preparing a second silicon substrate having a third silicon surface and a fourth silicon surface opposing the third silicon surface, the third silicon surface having a first portion covered by an insulating film and a second portion exposing a silicon surface, the surface of the insulating film being flush with the surface of the second portion; bonding said first silicon substrate and said second silicon substrate together such that a portion of the first silicon surface contacts the exposed silicon surface and such that the groove is located on the surface of the insulating film; grinding said first silicon substrate at the side of the second surface thereof to provide a fifth surface exposing therein the insulator of the groove through the bottom of the groove.

2. A method for manufacturing a silicon bonded wafer as defined in claim 1 wherein said first and second silicon substrate are a lightly doped substrate and a heavily doped substrate, respectively.

3. A method for manufacturing a silicon bonded wafer as defined in claim 1 wherein the groove has a shape of V-character.

4. A method for manufacturing a silicon bonded wafer as defined in claim 3 wherein the groove is filled with a polycrystalline silicon.

5. A method for manufacturing a silicon bonded wafer as defined in claim 1 wherein the groove has a shape of U-character.

6. A method for manufacturing a silicon bonded wafer as defined in claim 5 wherein the groove is filled with the insulator.

7. A method for manufacturing a silicon bonded wafer as defined in claim 6 wherein the groove has a depth smaller than about 10 μm.

8. A method for manufacturing a composite semiconductor device having a lateral transistor section and a vertical transistor section, comprising the steps of:

preparing a first substrate having a first surface and a second surface opposing the first surface, the first surface having at least one groove therein, at least the surface of the groove being covered by an insulator;

preparing a second substrate having a third surface and a fourth surface opposing the third surface, the third surface having a first portion covered by an insulating film and a second portion exposing a substrate material surface, the surface of the insulating film being flush with the surface of the second portion;

bonding said first substrate and said second substrate together, oriented such that a substrate material portion of the first surface contacts the exposed substrate material surface of the third surface and the groove is located on the surface of the insulating film;

grinding said first silicon substrate at the side of the second surface thereof to provide a fifth surface exposing therein the insulator of the groove through the bottom of the groove, thereby forming at least one said vertical transistor section and at least one said lateral transistor section which is insulated from said vertical transistor section.

9. A method of manufacturing a composite semiconductor device as defined in claim 8 wherein said step of preparing a first substrate comprises the steps of:

forming said at least one groove in said first surface;

forming said insulator on said first surface and said at least one groove so that the groove is filled;

grinding and polishing said insulator to expose said first surface and leave portions of said insulator in said at least one groove.

10. A method of manufacturing a composite semiconductor device as defined in claim 8 wherein said step of preparing a first substrate comprises the steps of:

forming said at least one groove in said first surface;

forming said insulator on said first surface and said at least one groove;

forming a polysilicon layer on said insulator;

grinding and polishing said polysilicon layer and said insulator to expose said first surface and leave portions of said polysilicon layer and said insulator in said at least one groove.

11. A method of manufacturing a composite semiconductor device as defined in claim 9 wherein said step of preparing a second substrate comprises the steps of:

forming said first portion of said third surface to be a flat recess;

forming said insulating film on said first portion and said second portion of said third surface;

grinding and polishing said insulating film so that said third surface has said first portion covered by said insulating film and said second portion exposing said substrate material surface.

12. A method of manufacturing a composite semiconductor device as defined in claim 11 wherein said first and second substrate are a lightly doped substrate and a heavily doped substrate, respectively.

13. A method for manufacturing a composite semiconductor device as defined in claim 10 wherein the groove has a shape of V-character.

14. A method for manufacturing a composite semiconductor device as defined in claim 9 wherein the groove has a shape of U-character.

15. A method for manufacturing a bonded wafer, comprising the steps of:

preparing a first substrate having a first semiconductor surface and a second surface opposing the first surface, the first surface having at least one groove therein, at least the surface of the groove being covered by an insulator;

preparing a second substrate having a third surface and a fourth surface opposing the third surface, the third surface having a first portion covered by an insulating film and a second portion exposing a substrate material surface, the surface of the insulating film being flush with the surface of the second portion;

bonding said first substrate and said second substrate together, oriented such that a portion of the first semiconductor surface contacts the exposed substrate material surface of the third surface and the groove is located on the surface of the insulating film;

grinding said first substrate at the side of the second surface thereof to provide a fifth surface exposing therein the insulator of the groove through the bottom of the groove.

16. A method of manufacturing a bonded wafer as defined in claim 15 wherein said step of preparing a first substrate comprises the steps of:

forming said at least one groove in said first surface;

forming said insulator on said first surface and said at least one groove so as to fill the groove;

grinding and polishing said insulator to expose said first surface and leave portions of said insulator in said at least one groove.

17. A method of manufacturing a bonded wafer as defined in claim 15 wherein said step of preparing a first substrate comprises the steps of:

forming said at least one groove in said first surface;

forming said insulator on said first surface and said at least one groove;

forming a polysilicon layer on said insulator;

grinding and polishing said polysilicon layer and said insulator to expose said first surface and leave portions of said polysilicon layer and said insulator in said at least one groove.

18. A method of manufacturing a bonded wafer as defined in claim 16 wherein said step of preparing a second substrate comprises the steps of:

forming said first portion of said third surface to be a flat recess;

forming said insulating film on said first portion and said second portion of said third surface;

grinding and polishing said insulating film so that said third surface has said first portion covered by said insulating film and said second portion exposing said substrate material surface.

19. A method of manufacturing a bonded wafer as defined in claim 18 wherein said first and second substrate are a lightly doped substrate and a heavily doped substrate, respectively.

20. A method for manufacturing a bonded wafer as defined in claim 17 wherein the groove has a shape of V-character.

21. A method for manufacturing a bonded wafer as defined in claim 18 wherein the groove has a shape of U-character.

22. A method for manufacturing a bonded wafer as defined in claim 18 wherein the groove is filled with the insulator.

* * * * *